(12) United States Patent
Yang et al.

(10) Patent No.: US 10,353,028 B2
(45) Date of Patent: Jul. 16, 2019

(54) CURRENT MAGNITUDE CONTROL AT DIFFERENT SECTIONS IN ONE COIL

(71) Applicant: Quality Electrodynamics, LLC, Mayfield Village, OH (US)

(72) Inventors: Xiaoyu Yang, Indiana, PA (US); Chris Allen, Euclid, OH (US)

(73) Assignee: Quality Electrodynamics, LLC, Mayfield Village, OH (US)

(*) Notice: Subject to any disclaimer, the term of this patent is extended or adjusted under 35 U.S.C. 154(b) by 166 days.

(21) Appl. No.: 15/339,107

(22) Filed: Oct. 31, 2016

(65) Prior Publication Data

US 2017/0146622 A1    May 25, 2017

Related U.S. Application Data

(60) Provisional application No. 62/257,837, filed on Nov. 20, 2015.

(51) Int. Cl.
*G01R 33/34*    (2006.01)
*G01R 33/36*    (2006.01)

(52) U.S. Cl.
CPC ... *G01R 33/3628* (2013.01); *G01R 33/34069* (2013.01)

(58) Field of Classification Search
CPC .............. G01R 33/3628; G01R 33/34069
See application file for complete search history.

(56) References Cited

U.S. PATENT DOCUMENTS

| | | | | |
|---|---|---|---|---|
| 2011/0267062 A1* | 11/2011 | Otake | ............... | G01R 33/3685 324/322 |
| 2012/0223709 A1* | 9/2012 | Schillak | ............. | G01R 33/3607 324/309 |
| 2013/0134979 A1* | 5/2013 | McDougall | ............ | G01R 33/34 324/322 |

* cited by examiner

*Primary Examiner* — Jermele M Hollington
*Assistant Examiner* — Feba Pothen
(74) *Attorney, Agent, or Firm* — Eschweiler & Potashnik, LLC (57) ABSTRACT

Example apparatus and magnetic resonance imaging (MRI) radio frequency (RF) coils concern controlling current magnitude at different sections in one MRI RF coil. In one embodiment, an MRI RF coil comprises a plurality of loop coils configured to transmit or receive an RF signal. A member of the plurality of loop coils comprises an inductor and at least one capacitor. The MRI RF coil further comprises at least one coaxial transmission line that electrically couple in series a first member of the plurality of loop coils with a second, different member of the plurality of loop coils. The at least one coaxial transmission line has a length that is one-quarter wavelength ($\lambda/4$) of the RF signal, or an odd integer multiple of $\lambda/4$ of the RF signal.

22 Claims, 10 Drawing Sheets

CURRENT MAGNITUDE CONTROL AT DIFFERENT SECTIONS IN ONE COIL

REFERENCE TO RELATED APPLICATION

This application claims priority to U.S. Provisional Application No. 62/257,837 filed on Nov. 20, 2015, the contents of which is hereby incorporated by reference in its entirety.

BACKGROUND

Magnetic resonance imaging (MRI) involves the transmission and receipt of radio frequency (RF) energy. RF energy may be transmitted by a coil. Resulting magnetic resonance (MR) signals may also be received by a coil. An RF coil may be a surface coil or a volume coil. A "surface" coil may be contained in a single plane. A "volume" coil (e.g., birdcage, solenoid) surrounds a volume to be imaged. MRI systems use RF transmit coils to produce a $B_1$ excitation field. At the higher frequencies required to induce resonance in higher $B_0$ fields, interactions between the $B_1$ field and the tissue being imaged result in inhomogeneous or non-uniform $B_1$ fields, which in turn reduces the quality of images obtained by an MRI system. Conventional attempts to address this $B_1$ non-uniformity issue include using multiple RF transmission coils, which may be arranged in a transmission coil array, instead of using a single RF transmission coil. The $B_1$ field can thus be made more homogenous by optimizing relative magnitudes and phases of currents on the multiple coils.

RF coils create the $B_1$ field that rotates the net magnetization in a pulse sequence. RF coils may also detect processing transverse magnetization. The difference in energy between the two orientations for the nuclei subjected to the $B_0$ and $B_1$ fields depends on the type of atom and the strength of the $B_0$ field. Higher strength $B_0$ fields may produce an increased signal to noise ratio (SNR) but may also cause other issues. For instance, increasing the $B_0$ field strength increases the energy differential between the two orientations but requires more RF energy to induce the transition between the orientations, which in turn increases the frequency of the RF signal required to produce a $B_1$ field. For example, RF energy applied at a frequency of approximately 64 MHz is used to bring a hydrogen nucleus into resonance in a 1.5 T $B_0$ field while RF energy applied at a frequency of approximately 300 MHz is used to bring the same hydrogen nucleus into resonance in a 7 T $B_0$ field.

Coils may be used for transmitting RF energy that is intended to cause nuclear magnetic resonance (NMR) in a sample. The frequency at which NMR will be created depends on the magnetic field present in the sample. Both the main magnetic field $B_0$ produced by the MRI apparatus and the additional magnetic field $B_1$ produced by a coil contribute to the magnetic field present in the sample. For a circular loop coil, the transmit $B_1$ field equals the coil sensitivity. A circular loop of radius a carrying a current I produces on axis the field: $B=\mu_0 I a^2/[2(a^2+z^2)^{3/2}]$.

An imaging coil needs to be able to resonate at a selected Larmor frequency. Imaging coils include inductive elements and capacitive elements. The resonant frequency, v, of an RF coil is determined by the inductance (L) and capacitance (C) of the inductor capacitor circuit (e.g. LC circuit) according to:

$$v = \frac{1}{2\Pi\sqrt{LC}}$$

Positioning coils in a transmit array may produce a more uniform $B_1$ field. However, transmit arrays produce additional problems. For example, to produce a uniform $B_1$ field it may be necessary to control the current flowing through each coil of the array. However, an RF pulse is defined by a voltage level input to an amplifier and thus unique loading of different coils in the transmit array may lead to different currents on the different coils. Different coils may experience unique loading due, for example, to different properties in different tissues being imaged and the proximity of the different coils to those different tissues.

Additionally, RF coils for MRI may need to be tuned and matched. Tuning involves establishing or manipulating the capacitance in a coil so that a desired resistance is produced. Matching involves establishing or manipulating the capacitance in a coil so that a desired reactance is achieved. When tuning, the impedance z may be described by $Z=R+jX=1/(1/(r+jL\omega)+jC\omega)$. Tuning may be performed to achieve a desired tuning frequency for a coil. $\omega_0$ identifies the desired tuning frequency. $\omega_0$, may be, for example, 63.87 MHz at 1.5 T. The size of a conventional coil facilitates estimating inductance L. With an estimate of L in hand, values for capacitors can be computed to produce a desired resonant peak in an appropriate location with respect to $\omega_0$. Once capacitors are selected, the resonant peak can be observed and a more accurate L can be computed. The capacitors can then be adjusted to produce the desired resistance. Once the desired resistance is achieved, then capacitance can be adjusted to cancel reactance.

A conventional loop coil has elements that produce a resistance (e.g., resistor) and that produce an inductance (e.g., inductor). A conventional loop coil may include a matching capacitor and a tuning capacitor. Conventionally, the resistor, inductor, and capacitor may all have been two terminal passive elements that were soldered to copper wire or copper foil that was attached to a printed circuit board.

Inductive coupling between coils also produces problems for MRI systems. Coils in a transmit array may become inductively coupled so that a change in the current flowing through one coil may induce a voltage in another coil. The mutual inductive coupling of coils in a transmit array further complicates controlling the current delivered to a coil in the transmission array.

One conventional approach for controlling currents on individual coils in a transmission array involves using individual isolation power amplifiers for each coil. Isolation power amplifiers differ from conventional power amplifiers by presenting a blocking impedance to a coil, which removes the effects of mutual inductive coupling, which in turn facilitates programming individual coils separately. However, this approach may produce additional problems. For example, MRI RF transmit coils may operate at frequencies and power ratings that may require custom, and thus costly, engineering of the isolation power amplifiers. Additionally, a separate isolation power amplifier may be required for each coil in the transmit array, which may increase cost, complexity, and size, while reducing reliability. While separate isolation power amplifiers may reduce or eliminate the effects of mutual inductive coupling, the coils in the transmission array may still exhibit different loading characteristics, which may then require each coil to be separately tuned to provide equal currents.

A saddle coil is one type of coil that uses multiple RF transmit coils. A saddle coil can be considered to be two loop-coils that are connected to create a reasonably uniform field between the two loop-coils. However, when the physical distance between the two loop coils exceeds a threshold distance (e.g., 10 cm, 30 cm, 60 cm) then connecting the two loop coils become problematic at high frequencies, e.g., 3 T, and it becomes difficult to build a saddle coil that provides satisfactory performance.

Figure 1:
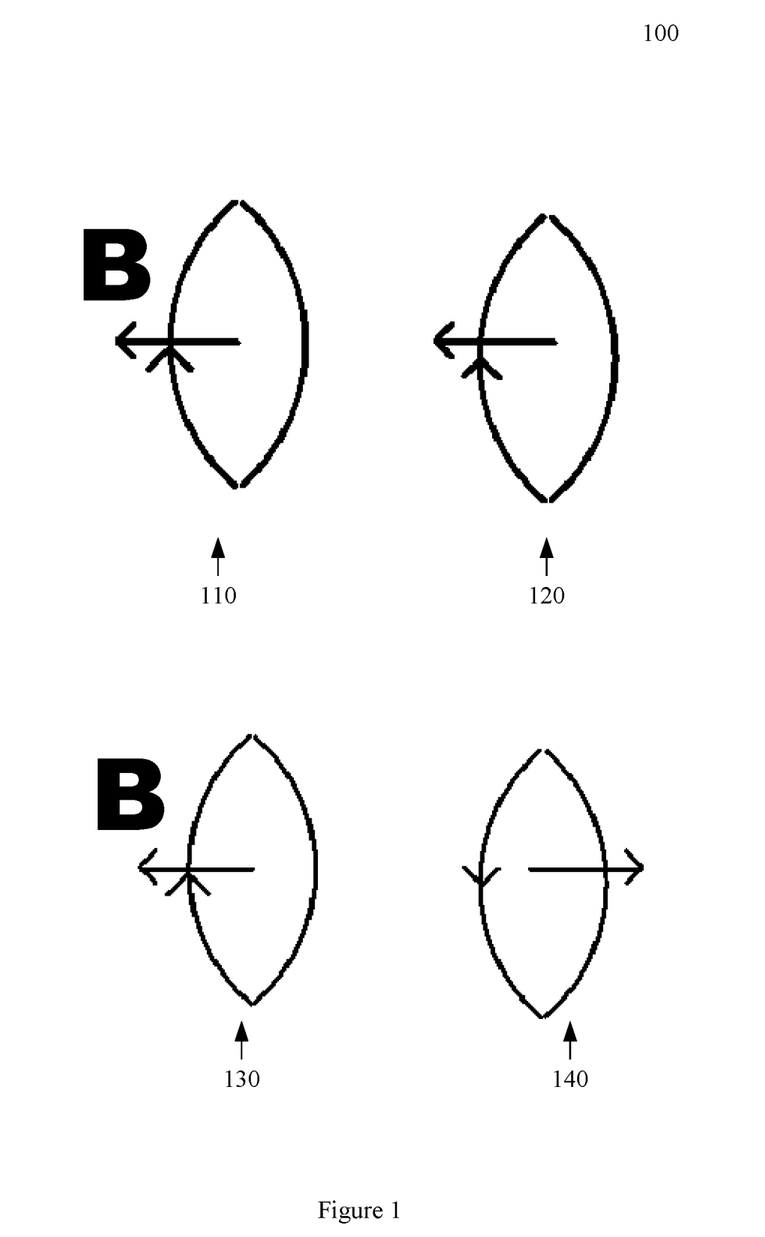
FIG. 1 illustrates pairs of loop coils that may intrinsically create two eigenmodes.

One conventional approach to improve the characteristics of a saddle coil is to match two loops independently and then to combine the two loops to create a saddle-like coil. This approach may create a symmetry issue if there is coupling between two loops. FIG. 1 illustrates two pairs of loop coils that may intrinsically create two eigenmodes. Loop 110 and loop 120 are separate, different coils. The two coils are matched independently. When the two coils are combined and a current in a first direction is introduced into the two coils, a magnetic field B is generated that is oriented in the same direction for both loop 110 and loop 120, thus producing a saddle mode. Loop 130 and loop 140 are separate, different coils similar to loop 110 and loop 120. When loop 130 and loop 140 are combined and have currents running in opposite directions, magnetic fields are generated such that loop 130 generates a magnetic field in an opposite direction to the magnetic field that loop 140 generates, thus producing an anti-saddle mode.

Figure 2:
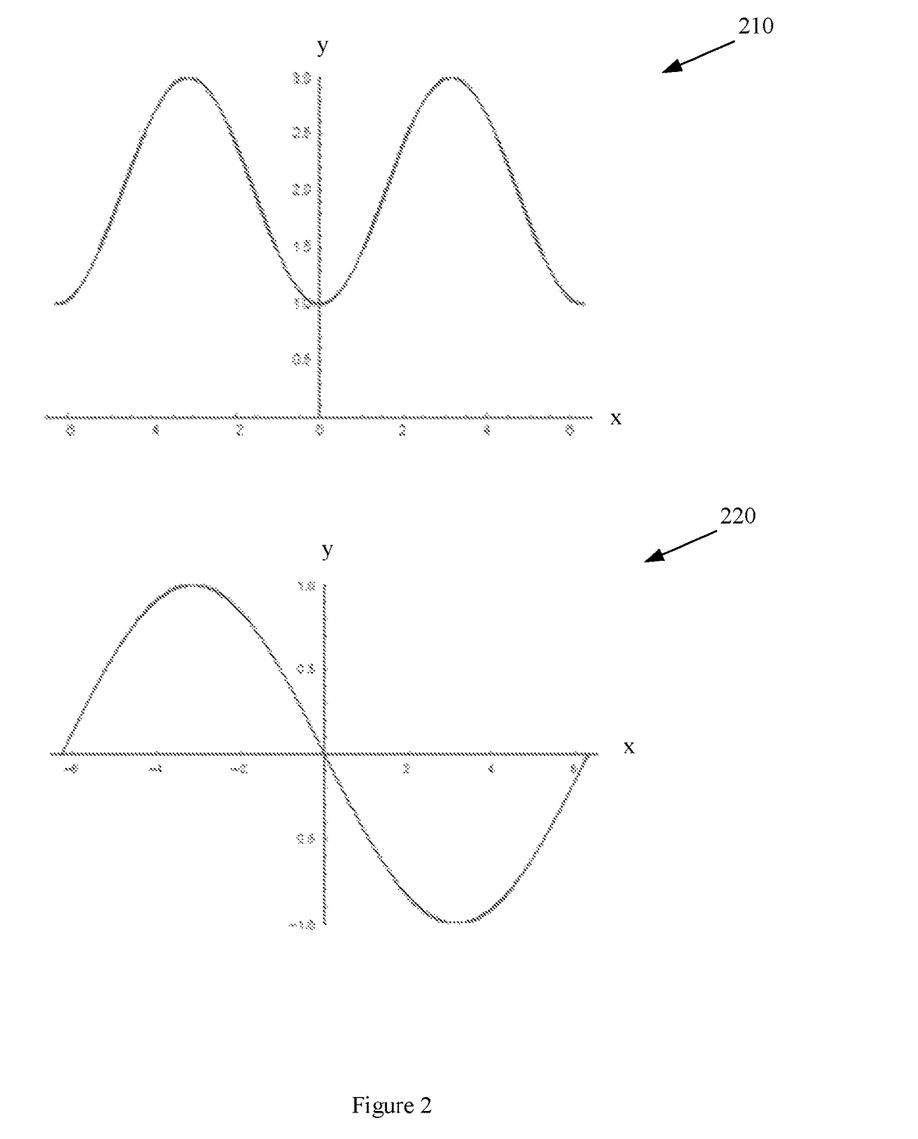
FIG. 2 illustrates graphs of B field profiles of loop coils configured in saddle-mode or anti-saddle mode.

FIG. 2 illustrates a first graph 210 of the B field profile of a saddle mode and a second graph 220 of the B field profile of an anti-saddle mode. The B field profile illustrated in first graph 210 of a saddle mode may be generated by, for example, loop 110 and loop 120 as illustrated in FIG. 1. The B field profile illustrated in second graph 220 of an anti-saddle mode may be generated by, for example, loop 130 and loop 140 as illustrated in FIG. 1. The x axes of first graph 210 and second graph 220 represent an axis through the center of both loops, and the y axis represents the magnitude of the B field. If two loops configured to function as a saddle coil do not inductively couple to each other, then their individual frequencies may be the same. The two coils can be driven either independently by two drivers or using one driver with a splitter. With appropriate phase and magnitude control, a clean saddle mode, a clean anti-saddle mode, or mixture of the two modes may be achieved. However, in practice, it is very rare to find two loops that do not couple because when being used to produce an image they are oriented towards each other.

If the two loops do couple to each other, then the saddle mode frequency and the anti-saddle mode frequency will not be same due to:

$$\frac{1}{2\pi\sqrt{c(L+M)}}$$

for saddle mode, and $$\frac{1}{2\pi\sqrt{c(L+M)}}$$

for anti-saddle mode, where c represents capacitance, L represents inductance, and M represents mutual inductance. Here, we assume that both loops have the same capacitance and inductance.

Figure 3:
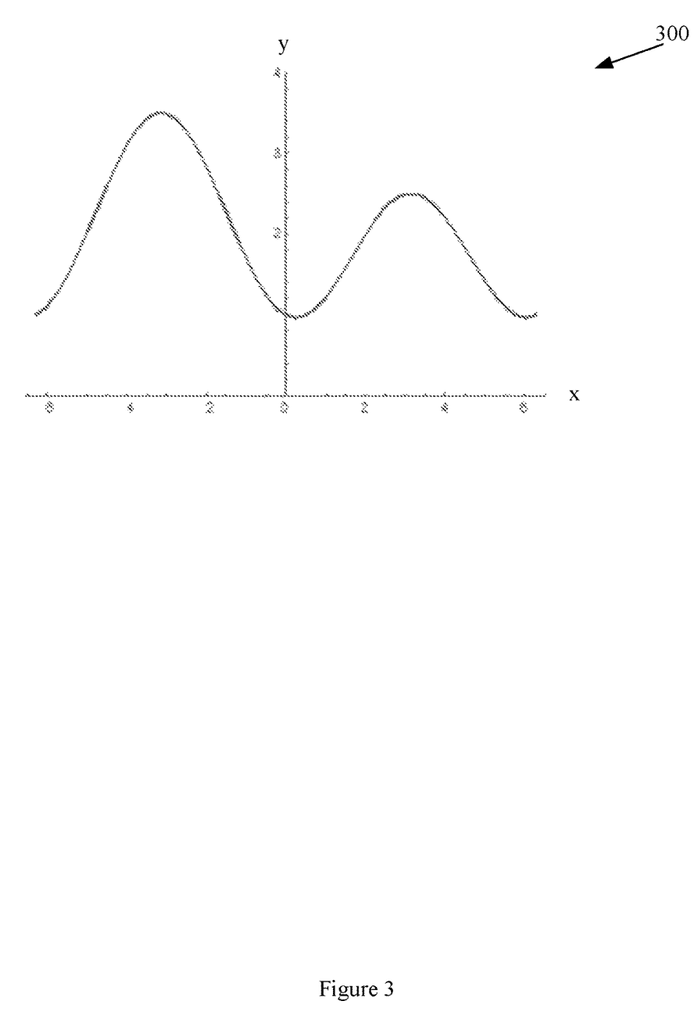
FIG. 3 illustrates a graph of a B field profile of loop coils configured in a coupled driving mode.

In practice, it may be difficult, if even possible at all, to drive two coils to create a clean saddle mode or a clean anti-saddle mode because of the coupling between the coils when they face each other. When coupling occurs, one result may be that a driving mode is a sum of the saddle mode illustrated by first graph 210 and the anti-saddle mode illustrated by second graph 220. This may result in the driving mode as illustrated in FIG. 3. FIG. 3 illustrates a graph 300 of a B field profile of a driving mode. The sum of the saddle mode illustrated by first graphy 210 and the anti-saddle mode illustrated by second graphy 220 may produce an asymmetrical B field profile like that illustrated by graph 300, which in turn produces a shading issue, thus reducing the utility of images produced by a conventional MRI system.

One conventional approach to improve symmetry in multiple transmit coils that are used together for MRI may attempt to provide a volume array coil with enforced uniform element currents for improved excitation homogeneity. For example, one approach uses multiple one-quarter wavelength (λ/4) transmission lines to drive multiple coils. This approach attempts to create equal current in each individually tuned and matched coil by varying the lengths of the transmission lines. In this approach, multiple λ/4 transmission lines are configured in parallel. The multiple λ/4 transmission lines require a common voltage point, the approach requires multiple baluns, and further requires the changing of cables connecting the coils to the common voltage point, or changing the intrinsic impedance of transmission lines, to change current magnitude ratios between the multiple coils. Thus, the conventional λ/4 transmission line approaches are not optimal because they require significant amounts of hardware to support in a clinical environment.

BRIEF DESCRIPTION OF THE DRAWINGS

The accompanying drawings, which are incorporated in and constitute a part of the specification, illustrate various example systems, methods, and other embodiments of various aspects of the invention. It will be appreciated that the illustrated element boundaries (e.g., boxes, groups of boxes, or other shapes) in the figures represent one example of the boundaries. One of ordinary skill in the art will appreciate that in some embodiments one element may be designed as multiple elements, multiple elements may be designed as one element, an element shown as an internal component of another element may be implemented as an external component and vice versa, and so on. Furthermore, elements may not be drawn to scale.

DETAILED DESCRIPTION

Figure 4:
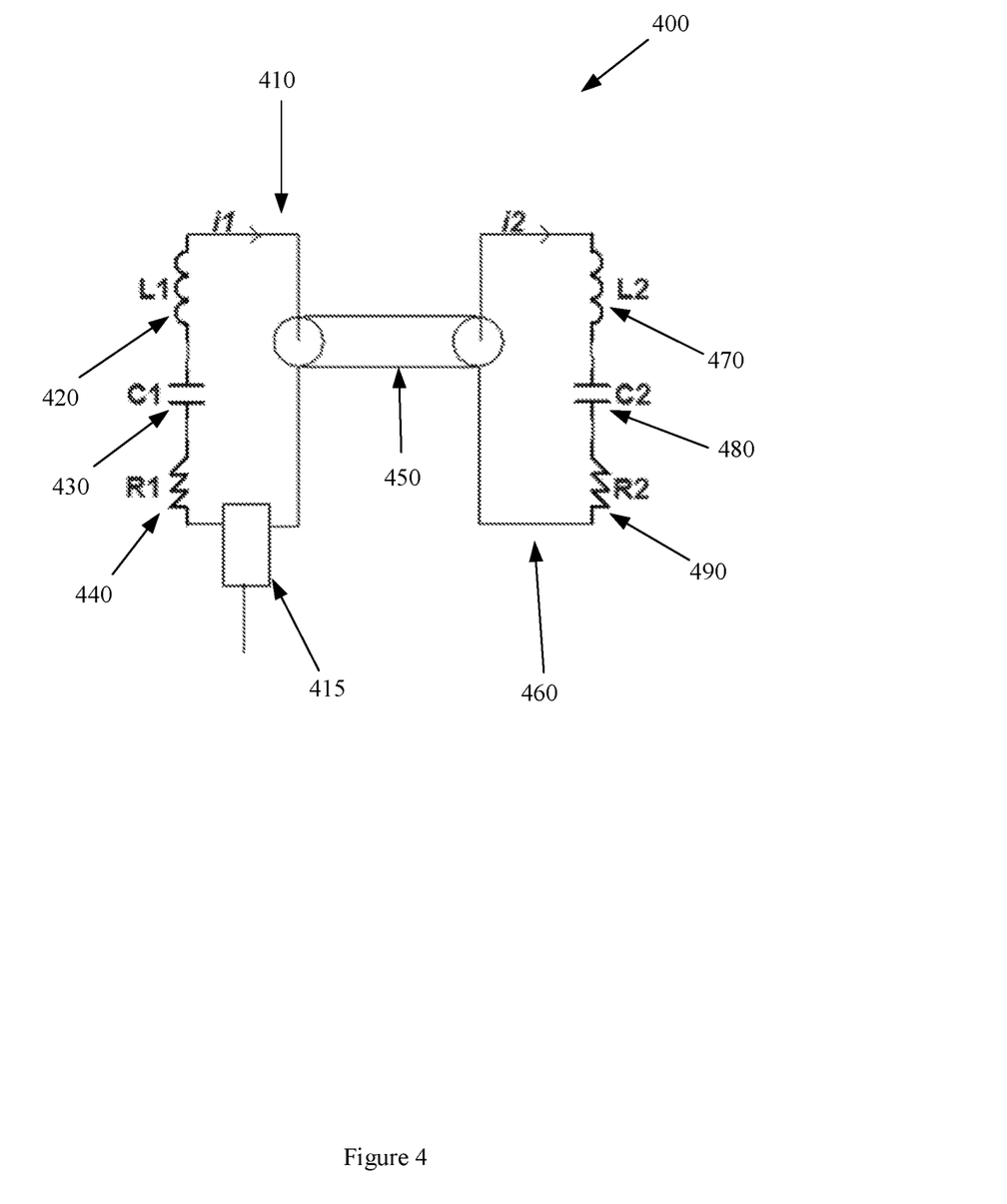
FIG. 4 illustrates an example MRI RF coil.

Example apparatus, systems, RF coils, and other embodiments described herein control current magnitude at different sections in an RF coil. Example apparatus, systems, and RF coils take an approach that does not use multiple λ/4 transmission lines configured in parallel that is different from conventional approaches that use multiple λ/4 transmission lines configured in parallel. The approach described herein provides easier and more convenient tuning for multiple coils connected in series with λ/4 coaxial transmission lines. FIG. 4 illustrates one example embodiment of an MRI RF coil 400 for generating a transmission field using multiple coils that have matched coil sensitivity. Example apparatus, systems, RF coils, and other embodiments also facilitate tuning multiple coils connected in parallel with λ/2 coaxial transmission lines.

FIG. 4 illustrates an MRI RF coil 400 comprising a first loop coil 410, a second loop coil 460, and at least one λ/4 transmission line 450. MRI RF coil 400 may be configured to receive or transmit an RF signal at a working frequency. The working frequency may be, for example, a Larmor frequency. The RF signal at the working frequency may correspond with a magnetic resonance frequency of an atomic nucleus found in a region of tissue being imaged by an MRI system to which MRI RF coil 400 is operably connected. Recall that an MRI RF coil is, at least in part, an LC circuit. First loop coil 410 is operably connected in series with second loop coil 460 by λ/4 transmission line 450. MRI RF coil 400 coil also comprises a matching circuit 415 which, in this embodiment, is operably connected with first loop coil 410 and with an MRI system.

The left side of FIG. 4 illustrates first loop coil 410. An inductance for first loop coil 410 is represented as an inductor L1 420. A capacitance for first loop coil 410 is represented as a capacitor C1 430. A coil loss for the first loop coil 410 is represented as a resistive element R1 440. The right side of FIG. 4 illustrates second loop coil 460. An inductance, capacitance, and coil loss for second loop coil 460 are represented as inductor L2 440, capacitor C2 480, and resistive element R2 490 respectively.

A resistive element may be a resistor. A resistor may be, for example, a passive, two-terminal electrical component that implements electrical resistance as a circuit element. Resistors reduce current flow. Resistors also lower voltage levels within circuits. Resistors may have fixed resistances or variable resistances. The current that flows through a resistor is directly proportional to the voltage applied across the resistor's terminals. This relationship is represented by Ohm's Law: V=IR, where I is the current through the conductor, V is the potential difference across the conductor, and R is the resistance of the conductor.

An inductor may be a passive two-terminal electrical component that resists changes in electric current. An inductor may be made from, for example, a wire that is wound into a coil. When a current flows through the inductor, energy may be stored temporarily in a magnetic field in the coil. When the current flowing through the inductor changes, the time-varying magnetic field induces a voltage in the inductor. The voltage will be induced according to Faraday's law and thus may oppose the change in current that created the voltage.

A capacitor may be a passive, two-terminal electrical component that is used to store energy. The energy may be stored electrostatically in an electric field. Although there are many types of practical capacitors, capacitors tend to contain at least two electrical conductors that are separated by a dielectric. The conductors may be, for example, plates and the dielectric may be, for example, an insulator. The conductors may be, for example, thin films of metal, aluminum foil or other materials. The non-conducting dielectric increases the capacitor's charge capacity. The dielectric may be, for example, glass, ceramic, plastic film, air, paper, mica, or other materials. Unlike a resistor, a capacitor does not dissipate energy. Instead, a capacitor stores energy in the form of an electrostatic field between its conductors. A capacitor may be a variable capacitor.

First loop coil 410 and second loop coil 460 are electrically connected together with λ/4 transmission line 450. λ/4 transmission line 450 is a coaxial cable. λ/4 transmission line 450 has an intrinsic or characteristic impedance. The intrinsic or characteristic impedance of the λ/4 transmission line 450 is represented as $Z_0$. The length of the λ/4 transmission line 450 may be an odd number of quarter-wavelengths (e.g., ¼, ¾, 5/4, . . . ) of the RF signal wavelength, including odd integer multiples of λ/4. The λ/4 transmission line 450 is configured to function as part of first loop coil 410 or second loop coil 460 in series, thus facilitating first loop coil 410, λ/4 transmission line 450, and second loop coil 460 operating together as a single MRI RF coil.

Figure 5:
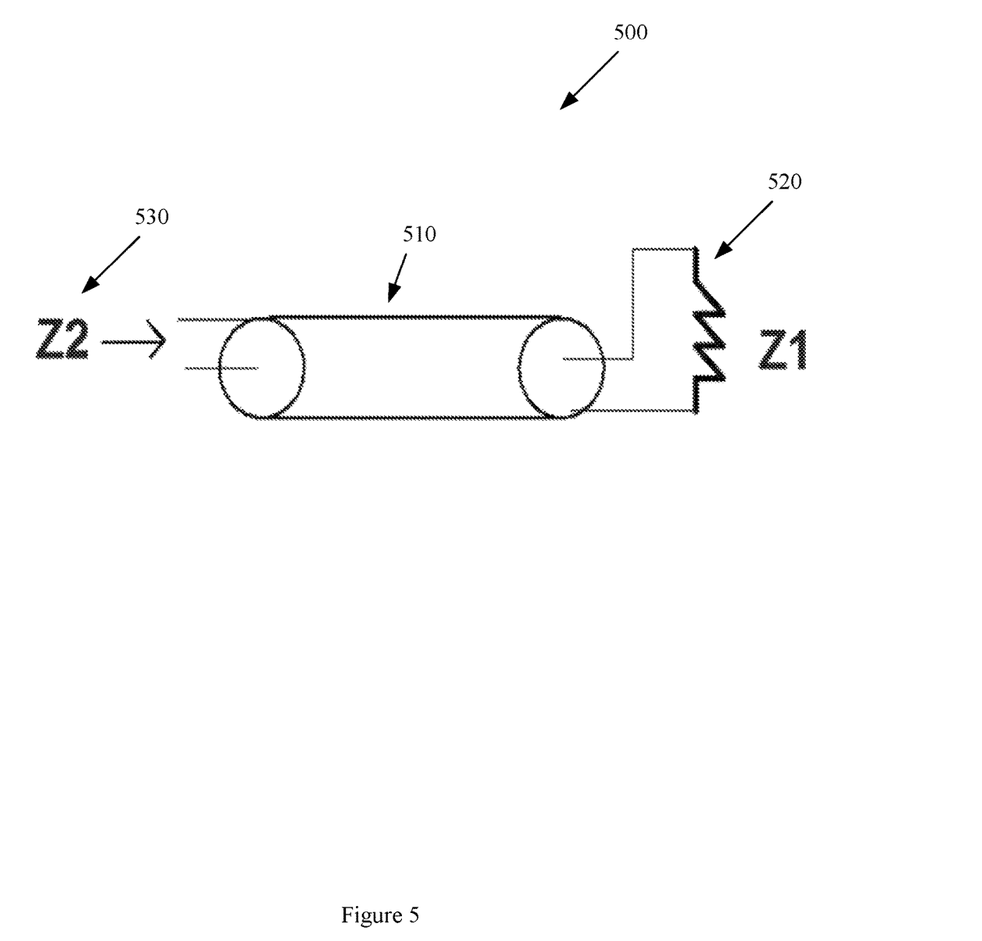
FIG. 5 illustrates portions of an example MRI RF coil.

FIG. 5 illustrates portions of an example MRI RF coil 500. MRI RF coil 500 includes a coaxial transmission line 510 having a length that equals an odd number of quarter wavelengths of an RF signal. MRI RF coil 500 may also include a first coil and a second coil. Coaxial transmission line 510 may function as a transformer. Recall that a coaxial cable includes an inner conductor and an outer conductor or shield. In coaxial cable, energy propagates in an axial direction in the region between the two conductors. The impedance $Z_2$ 530 associated with the first coil can be computed according to:

$$Z_2 = \frac{Z_0^2}{Z_1}$$

where $Z_1$ 520 represents the impedance associated with the second coil, and $Z_0$ represents an intrinsic or characteristic impedance of the transmission line 510.

$Z_1$ and $Z_2$ can be complex. Furthermore, according to Ohm's law, $$i = \frac{V}{Z}.$$

Thus, a current $i_1$ in the first coil can be written as $$i_1 = \left|\frac{V_1}{Z_1}\right|,$$

where $V_1$ is the voltage across $Z_1$. If we define V2 as the voltage across $Z_2$, then $$i_2 = \left|\frac{V_2}{Z_2}\right|.$$

Returning to FIG. 4, let currents in first loop coil 410 and second loop coil 460 be represented by $i_1$ and $i_2$ as illustrated in FIG. 4. First loop coil 410 may see a first impedance $Z_1$ across the connecting points of λ/4 transmission line 450. The other end of λ/4 transmission line 450 may see the second loop coil 460 as the second impedance $Z_2$. Thus, the power into the λ/4 transmission line 450 from the first loop coil 410 side is described by:

$$V_1 \cdot i_1 = i_1 * z_1 \cdot i_1 = i_1 * \frac{z_0^2}{z_2} \cdot i_1$$

which means that the power into second loop coil 460 can be described by:

$$i_2 * Z_2 \cdot i_2.$$

Assuming that the transmission line (e.g. λ/4 transmission line 450 or transmission line 510) is lossless, then the two powers must be equal to each other due to power conservation. This leads to the realization that:

$$\left(\frac{i_1}{i_2}\right)^2 = \left(\frac{z_2}{z_0}\right)^2.$$

Therefore, tuning the right loop total impedance to a specified value, including to either $j_{Z0}$ or $-j_{Z0}$, or to within a threshold amount of either $j_{Z0}$ or $-j_{Z0}$, where $j_{Z0}$ represents the imaginary component of the intrinsic or characteristic impedance of the transmission line, will cause the magnitudes of $i_1$ and $i_2$ to be the same magnitude but of the opposite sign. This assumes that the magnitude of the resistance $R_2$ of resistive element R2 490 is small due to the second loop coil 460's Q being high, where Q is defined as the impedance of L2 470 at the working frequency divided by $R_2$. Thus, tuning the total impedance of second loop coil 460 to either $j_{Z0}$ or $-j_{Z0}$ associated with λ/4 transmission line 450 will cause the magnitude of a current $i_2$ in second loop coil 460 to be the same as the magnitude of a current $i_1$ in first loop coil 410. The sign of impedance controls the direction of the current flow.

Example embodiments also facilitate controlling a current magnitude ratio between loop coils by controlling $Z_2$. If the right loop, including, for example, second loop coil 460, is tuned to within a threshold of $j_{Z0}$ or $-j_{Z0}$, then the right loop will not be in resonance anymore because either inductive or capacitive impedance of the right loop must be greater than that of the other side, including, for example, first loop coil 410, to achieve $j_{Z0}$ or $-j_{Z0}$. In resonance, either the inductive or capacitive impedance of a loop coil on one side must be equal to the inductive or capacitive impedance of the loop coil on the other side. If second loop coil 460 is tuned to $jz_0$ or $-jz_0$, then coil 410 will see $-jz_0$ or $jz_0$ at the other end of the transmission line. The capacitance of capacitor C1 430 or the inductance of inductor L1 420 in first loop coil 410 may be adjusted such that they not only resonate to themselves but also resonate to $-jz_0$ or $jz_0$. Adjusting the capacitance of capacitor C1 430 or the inductance of inductor L1 420 may thus make first loop coil 410 and second loop coil 460 resonate as one resonant circuit so that mutual inductance between first loop coil 410 and second loop coil 460 becomes irrelevant.

In one embodiment, the current magnitude ratio for a given RF coil that comprises a plurality of loop coils connected by at least one coaxial λ/4 transmission line as described herein can be adjusted by changing a capacitance within a member of the plurality of loop coils. First loop coil 410 or second loop coil 460 are, in this embodiment, individually tunable. For example, first loop coil 410 may comprise a variable capacitor, or second loop coil 460 may comprise a variable capacitor. In this example, capacitor C1 430 may be a variable capacitor, or capacitor C2 480 may be a variable capacitor. Varying the capacitance of capacitor C2 480 changes the impedance of the second loop coil 460.

Thus, adjusting the capacitance of capacitor C2 480 may change the current magnitude ratio between a first current magnitude in first loop coil 410 and a second current magnitude in second loop coil 460 without having to change the λ/4 transmission line 450. After the current magnitude adjustment, capacitor C1 430, which in this example is a variable capacitor, may be adjusted to ensure that both first loop coil 410 and second loop coil 460 are still in resonance. Example embodiments thus improve on conventional approaches in which, to adjust the current magnitude ratio between coils, a λ/4 wire with a first length must be substituted with a λ/4 wire of a second, different impedance.

Thus, in example embodiments, a first current magnitude, such as the current magnitude of first loop coil 410, may be used as a baseline for adjusting current magnitudes in other loops in the RF coil 400. The impedance of first loop coil 410 may be used for tuning purposes. The impedance of other loops, including the impedance of second loop coil 460, may be compared against the intrinsic impedance of λ/4 transmission line 450 for current magnitude control. Recall the formula i1/i2=z2/z0. Note that there is no z1 in this formulation.

MRI RF coil 400 is configured to be mechanically and electrically coupled to an MRI system. MRI RF coil 400 may be configured to be mechanically and electrically coupled to an MRI system through matching circuit 415. MRI RF coil 400 may be a member of a set of different MRI coils that can be attached to and detached from an MRI system. In one embodiment, MRI RF coil 400 includes a copper trace configured to receive RF energy. In one embodiment, the MRI RF coil 400 includes a complete coil. In another embodiment, MRI RF coil 400 does not comprise matching circuit 415. In embodiments where MRI RF coil 400 does not comprise matching circuit 415, tuning the total impedance of first loop coil 410 to within a threshold amount of either $j_{Z0}$ or $-j_{Z0}$ associated with λ/4 transmission line 450 will cause the magnitude of a current $i_1$ in first loop coil 410 to be the same as the magnitude of a current $i_2$ in second loop coil 460.

Thus, for a λ/4 configuration as described herein with respect to MRI RF coil 400, for two loops we know that $$\left(\frac{i_1}{i_2}\right) = \left(\frac{z_2}{z_0}\right).$$

Therefore, the capacitor C1 430, which may be a variable capacitor, in first loop coil 410 may be used for coil tuning, i.e., tuning the frequency of the whole MRI RF coil 400. The capacitor C2 480, which may be a variable capacitor, in second loop coil 460 may be used for current magnitude adjustment. When capacitor C2 480 in loop 460 is adjusted, the magnitude of z2 will change, as a result i1/i2 will change while the magnitude of z0 does not change. After adjusting capacitor C2 480, the frequency of the whole MRI RF coil 400 is changed, and variable capacitor C1 430 in loop 410 may be used to tune the frequency back while the current magnitude ratio is kept constant.

Circuits, apparatus, MRI RF coils, and other embodiments described herein are described with reference to the drawings in which like reference numerals are used to refer to like elements throughout, and where the illustrated structures are not necessarily drawn to scale. Embodiments are to cover all modifications, equivalents, and alternatives falling within the scope of the invention. In the figures, the thicknesses of lines, layers and/or regions may be exaggerated for clarity. Nothing in this detailed description (or drawings included herewith) is admitted as prior art.

Like numbers refer to like or similar elements throughout the description of the figures. When an element is referred to as being "connected" to another element, it can be directly connected to the other element or intervening elements may be present. In contrast, when an element is referred to as being "directly connected" to another element, there are no intervening elements present. Other words used to describe the relationship between elements should be interpreted in a like fashion (e.g., "between" versus "directly between," "adjacent" versus "directly adjacent," etc.).

The approach implemented with MRI RF coil 400 is not limited to only two loop coils. Embodiments described herein may be extended to daisy-chain or otherwise connect a plurality of loop coils using at least one λ/4 transmission lines to create one single coil. Furthermore, a current pattern associated with the plurality of loop coils can be adjusted to fit clinical needs by individually tuning members of the plurality of loop coils by, for example, adjusting the capacitance of a variable capacitor in a loop coil. Individual loop coils (e.g. first coil 410, second coil 460) may be individually tuned by adjusting the capacitance of a variable capacitor associated with an individual loop coil. One example of a three-loop coil is illustrated in FIG. 6.

Figure 6:
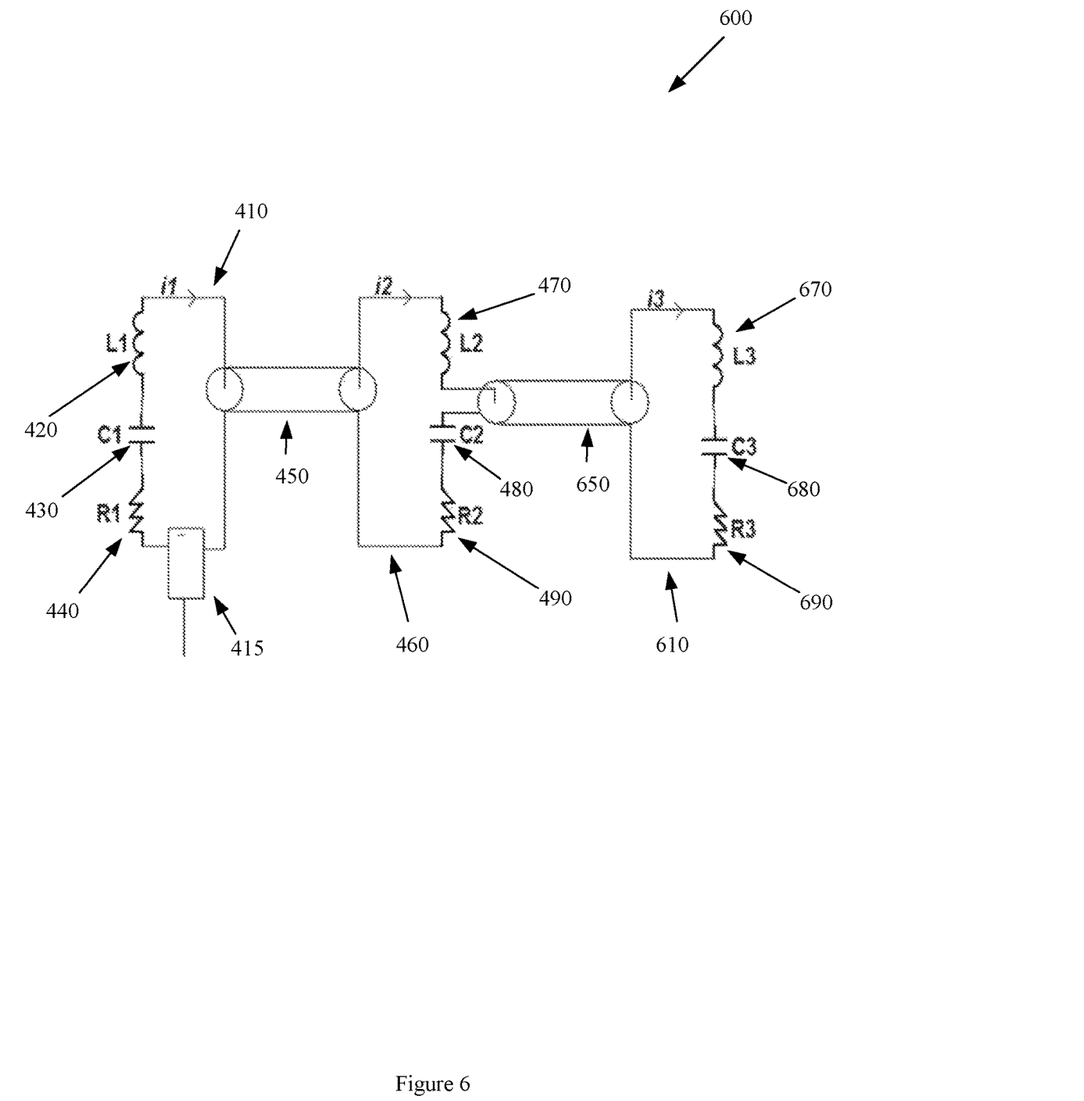
FIG. 6 illustrates an example MRI RF coil.

FIG. 6 illustrates a three-loop MRI RF coil 600. MRI RF coil 600 may be configured to receive or transmit an RF signal at a working frequency, including a Larmor frequency. MRI RF coil 600 comprises a first RF loop coil 410, a first λ/4 transmission line 450, and a second RF loop coil 460 that are similar to first loop coil 410, λ/4 transmission line 450, and second loop coil 460 illustrated in FIG. 4. MRI RF coil 600 further comprises a second λ/4 transmission line 650, and a third RF loop coil 610. λ/4 transmission line 450 and λ/4 transmission line 650 are coaxial cables. By adjusting the capacitance of capacitor C1 430, capacitor C2 480, or capacitor C3 680, the impedance of first RF loop coil 410, second RF loop coil 460, or third RF loop coil 680 may be adjusted. Adjusting the impedance of third RF loop coil 680, or second RF loop coil 460 may alter the current generated in third RF loop coil 680, or second RF loop coil 460 against current generated in first RF loop coil 410, thus customizing the $B_1$ field generated by MRI RF coil 600 at different points associated with first RF loop coil 410, second RF loop coil 460, or third RF loop coil 680. While FIG. 6 illustrates MRI RF coil 600 comprising three RF loop coils, example embodiments are not limited to three RF loop coils. Another embodiment may comprise a plurality of loop coils including more than three RF loop coils, including 4 loop coils, 8 loop coils, or other, different numbers of loop coils. Members of the plurality of loop coils may be configured in different transmission array configurations. For example, in one embodiment, the plurality of loop coils may be configured as a saddle array. In another embodiment, the plurality of loop coils may be configured as a star topology array. In another embodiment, the plurality of loop coils may be configured in a circular array as a whole-body coil. In other embodiments, other array configurations or topologies may be employed.

Figure 7:
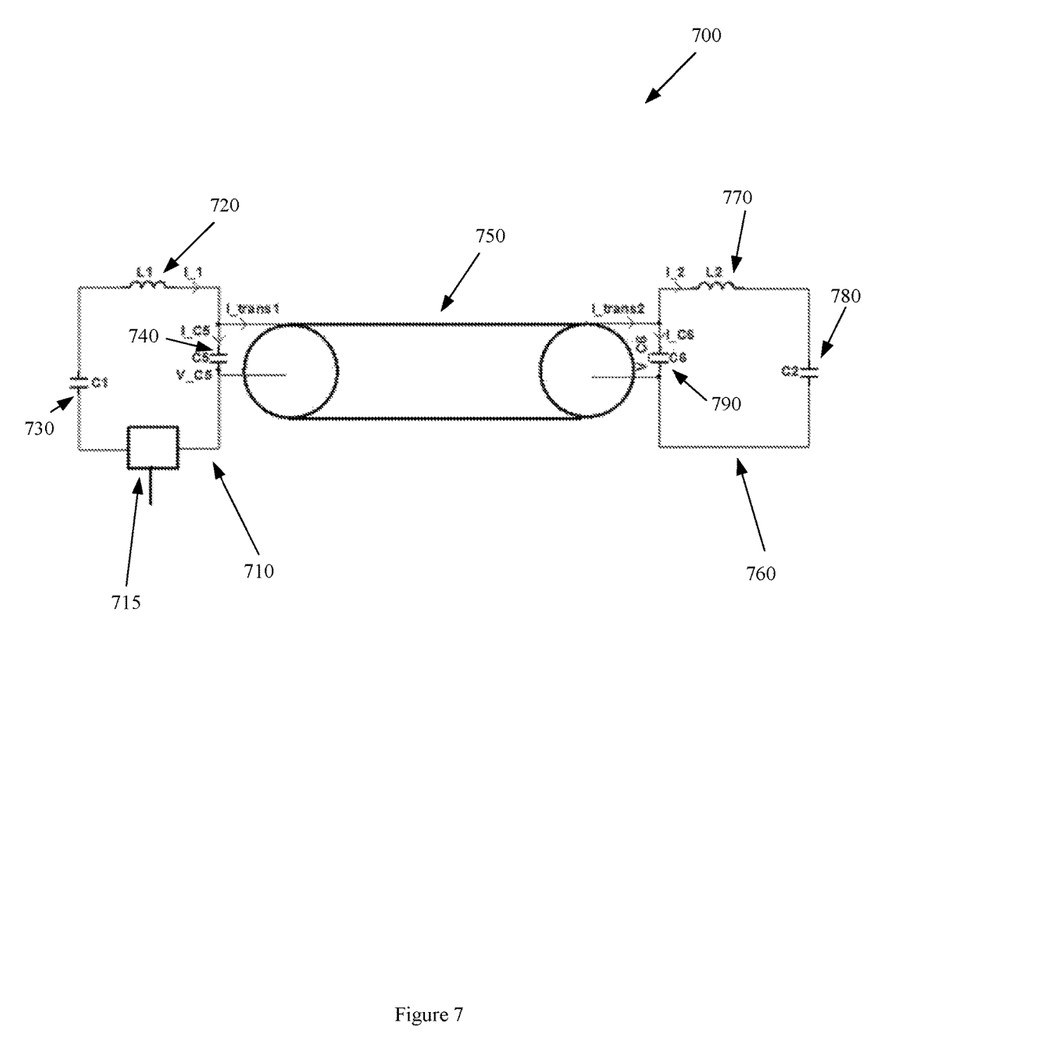
FIG. 7 illustrates an example MRI RF coil.

FIG. 7 illustrates an MRI RF coil 700 configured to receive or transmit an RF signal. MRI RF coil 700 may be configured to receive or transmit an RF signal at a working frequency, including a Larmor frequency. MRI RF coil 700 is similar to MRI RF coil 400, but includes additional elements. MRI RF coil 700 comprises a plurality of loop coils and at least on coaxial transmission line. In one embodiment, MRI RF coil 700 comprises a first RF loop 710 operably connected with a λ/2 (one-half wavelength) coaxial transmission line 750, and a second RF loop 760 operably connected with the coaxial transmission line 750. In the embodiment illustrated in FIG. 7, first RF loop 710 and second RF loop 760 are connected in parallel via λ/2 coaxial transmission line 750.

In one embodiment, first RF loop 710 comprises an inductor 720, a first capacitor C1 730, and a second capacitor C5 740. Coaxial transmission line 750 is connected with first RF loop 710 across second capacitor C5 740. Recall that a coaxial cable comprises an inner conductor, an insulator, a shield, and an outer jacket. Thus, in one embodiment, coaxial transmission line 750 is connected through a shield at a first point on first RF loop 710, and connected through an inner conductor at a second point on first RF loop 710 across second capacitor C5 740. Second RF loop 760 comprises an inductor 770, a first capacitor C2 780, and a second capacitor C6 790. Inductor 770, first capacitor C2 780, and second capacitor C6 790 resonate at the working frequency. Co-axial transmission line 750 is connected with second RF loop 760 across second capacitor C6 790. For example, coaxial transmission line 750 may be connected through a shield at a first point on second RF loop 760, and connected through an inner conductor at a second point on second RF loop 760 across second capacitor C6 790. The first point corresponds with a first terminal of second capacitor C5 740, or a first terminal of second capacitor C6 790. The second point corresponds with a second terminal of second capacitor C5 740, or a second terminal of second capacitor C6 790. The inner conductor is continuous from first RF loop 710 to second RF loop 760. The shield is continuous from first RF loop 710 to second RF loop 760. In one embodiment, second capacitor C6 790 may be configured to function as an inductor. Recall that if second capacitor C6 790 is configured as an inductor, second capacitor C6 790, as an inductor, still resonates with inductor 770 and first capacitor C2 780 at the working frequency. First capacitor C1 730, second capacitor C5 740, first capacitor C2 780, or second capacitor C6 790 may be variable capacitors.

In one embodiment, first RF loop 710 further comprises a matching circuit 715. Matching circuit 715 may be connected to an MRI system. When exposed to an RF signal at the working frequency, first RF loop 710 and second RF loop 760 may couple to each other. First RF loop 710 may experience a current $I_1$. Second RF loop 760 may experience a current $I_2$. $I_{C5}$ represents the current through second capacitor C5 740. $V_{C5}$ represents the voltage across second capacitor C5 740. $I_{\rightarrow trans1}$ represents the current from first RF loop 710 through the shield of co-axial transmission line 750. $I_{\rightarrow trans2}$ represents the current from the shield of coaxial transmission line 750 through second RF loop 760. $I_{C6}$ represents the current through second capacitor C6 790. $V_{C6}$ represents the voltage across second capacitor C6 790.

Referring to the left side of FIG. 7, with respect to first RF loop 710, we have $$I_1 = I_{C5} + I_{\rightarrow trans1} \qquad\qquad (\text{Eq.1}).$$

Following from equation 1, we have $$I_{\rightarrow trans1} = V_{C5}/(Z_{C6} // Z_{L2C2}) \qquad\qquad (\text{Eq. 2}).$$

where $Z_{C6}$ represents the impedance of second capacitor C6 790 at the working frequency. $Z_{L2C2}$ is the impedance of second RF loop 760 when viewed from the point of view of second capacitor C6 790, and "//" indicates that second capacitor C6 790 is in parallel with $Z_{L2C2}$. In loop 760 C6 790 may resonate with inductor L2 770 and first capacitor C2 780. When second capacitor C6 790 resonates with inductor L2 770 and first capacitor C2 780 we observe high impedance across second capacitor C6 790. Therefore, $I_{trans1}$ is very small. For example, if the impedance of second capacitor C6 790 at the working frequency is –j50, then the combined impedance of inductor L2 770 and first capacitor C2 780 is j50 due to resonance. It is known that the second RF loop 760 may have a Q greater than ten. In one example, second RF loop 760 has a Q=10 and the voltage across second capacitor C6 790 is represented as V. Then current through second capacitor C6 790 is V/j50 and I_trans1 is approximately V/(10^2*5)=V/500 which is 10% of the current through second capacitor C6 790. Thus, the magnitude of I_trans1 is approximately Q times smaller than the current through second capacitor C6 790. In one embodiment, a Q value that is ten times smaller is small enough. The current through second capacitor C6 790 may be expressed as $I_{C6}=V_{C6}/C_6$. Thus $I_{C6}$ also equals the current through second RF loop 760 because $I_{trans1}$ is very small.

From equation 1 and equation 2, we see that:

$$I_2 = V_{C6}/Z_{C6} = V_{C6}/Z_{L2C2} \quad \text{(Eq. 3)}.$$

Recall that coaxial transmission line 750 is a λ/2 or integer multiple of λ/2 coaxial transmission line at the working frequency. Thus, it follows that $$V_{C5} = V_{C6}. \quad \text{(Eq. 4)}$$

Combining equation 1, equation 2, equation 3, and equation 4 results in:

$$I_1 = \frac{V_{C5}}{Z_{C5}} \text{ and } I_2 = \frac{V_{C6}}{Z_{C6}} \quad \text{(Eq. 5)}$$

Recall also that second capacitor C6 790 will resonate with inductor L2 770 and first capacitor C2 780 at the working frequency. By adjusting the ratio between $Z_{C6}$ and $Z_{C5}$ example embodiments facilitate controlling the current magnitude ratio between first RF loop 710 and second RF loop 760.

If $Z_{C5}=-Z_{C6}$, when, for instance, second capacitor C6 790 is configured to function as an inductor and the impedance of second capacitor C6 790 has the same magnitude as $Z_{C5}$ but with the opposite sign, then $I_1=I_2$. Thus, example embodiments described herein may employ coaxial transmission lines having a length of λ/2 of the RF signal or integer multiples of λ/2 of the RF signal to ensure that first RF loop 710 and second RF loop 760 have the same current magnitude. The direction of the current may be controlled by flipping the connection between the coaxial transmission line and a loop. For example, if coaxial transmission line 750 is connected through the shield at the second point on second RF loop 760, and connected through the inner conductor at the first point on second RF loop 760 across second capacitor C6 790, the direction of the current $I_2$ may be reversed.

First capacitor C1 730, second capacitor C5 740, first capacitor C2 780, or second capacitor C6 790 may be variable capacitors. Adjusting the total impedance of first RF loop 710 or second RF loop 760 by varying the capacitance of first capacitor C1 730, second capacitor C5 740, first capacitor C2 780, or second capacitor C6 790 to within a threshold of the intrinsic impedance of coaxial transmission line 750 therefore results in $I_1=I_2$. Similarly, adjusting the total impedance of first RF loop 710 or second RF loop 760 by adjusting the capacitance of first capacitor C1 730, second capacitor C5 740, first capacitor C2 780, or second capacitor C6 790 such that $I_1 \neq I_2$ results in different current magnitude ratios between first RF loop 710 and second RF loop 760, and consequently different $B_1$ fields at first RF loop 710 and second RF loop 760. Example embodiments thus facilitate the provision of customizable $B_1$ fields at different points of an MRI RF coil, including MRI RF coil 700.

MRI RF coil 700 is not limited to the two-loop coil example illustrated in FIG. 7. In other embodiments, MRI RF coil 700 may comprise a plurality of loop coils, including more than two loop coils connected in parallel by at least one λ/2 coaxial transmission lines. MRI RF coil 700 may be configured as a saddle array, as a circular array, as a whole-body coil, or in other configurations. When configured as a saddle coil, a first member of the plurality of loop coils may be located at least 60 cm from a second member of the plurality of loop coils.

Thus, for a λ/2 configuration as described herein with respect to MRI RF coil 700, a variable capacitor in first RF loop 710 may be used for coil tuning. The capacitor C5 740 in second RF loop 760 which connects to coaxial transmission line 750 resonates with the other inductors L2 770 and capacitors C2 780 and C6 790 of second RF loop 760. Capacitor C5 740 and capacitor C6 790, which are at the two ends of coaxial transmission line 750, determine the current magnitude ratio between first RF loop 710 and second RF loop 760. Thus, if the capacitance of capacitor C6 790 in second RF loop 760 that connects to coaxial transmission line 750 is changed, the current ratio will change and the $2^{nd}$ coil frequency will shift. The inductance of inductor L2 770 and capacitance of capacitor C2 780 in second RF loop 760 may be adjusted to ensure that second RF loop 760 remains tuned.

Figure 9:
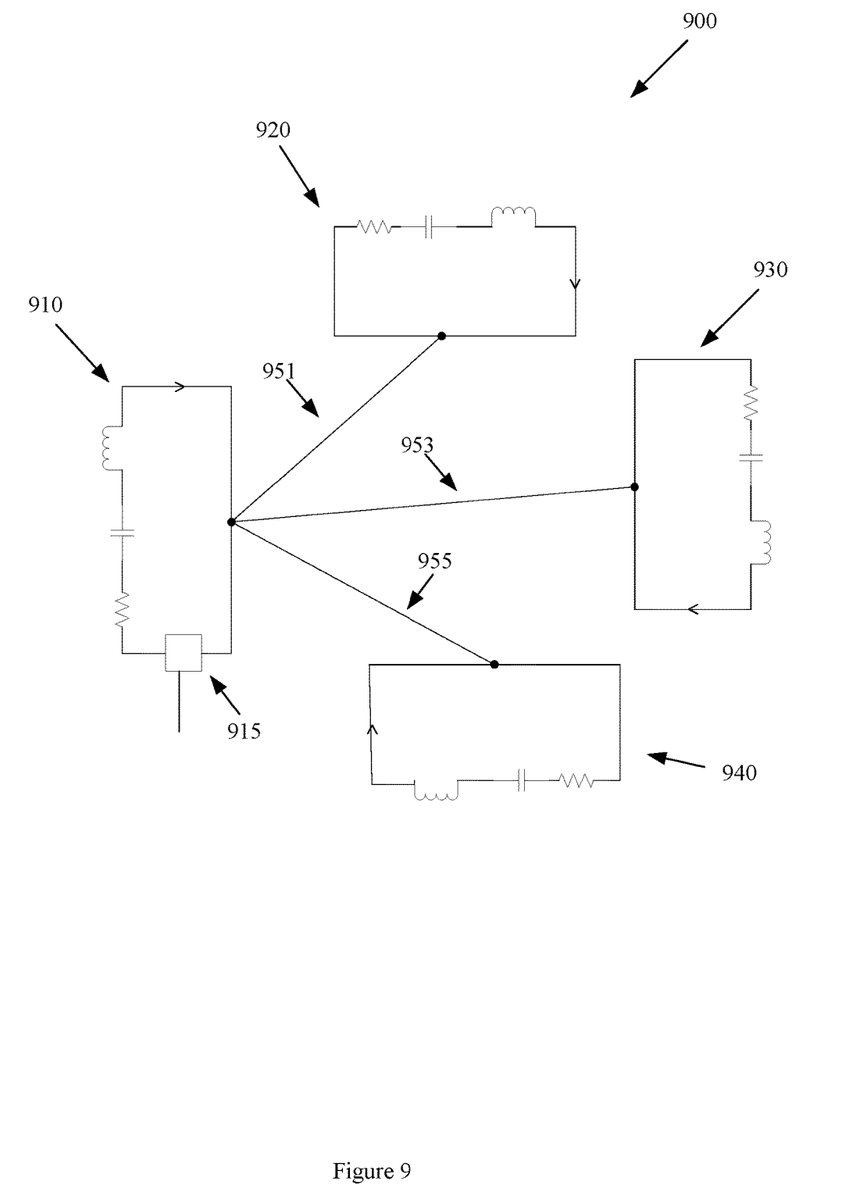
FIG. 9 illustrates an example MRI RF coil.

FIG. 9 illustrates an MRI RF coil 900 configured to receive or transmit an RF signal. MRI RF coil is configured with a different topology than MRI RF coil 400, MRI RF coil 600, or MRI RF coil 700. MRI RF coil 900 comprises a plurality of loop coils connected using λ/4 transmission lines according to a star topology. MRI RF coil 900 comprises a plurality of loop coils, including loop coils 910, 920, 930, and 940. A member of the plurality of loop coils, including loop coils 910, 920, 930, or 940 may comprise an inductor, a capacitor, or a resistor. Loop coils 910, 920, 930, or 940 may be individually tunable. Loop coil 910 is connected by transmission lines 951, 953, and 955 to loop coils 920, 930, and 940 respectively. Transmission lines 951, 953, and 955 may have lengths λ/4 of the RF signal, or of odd multiples of λ/4 of the RF signal. Transmission lines 951, 953, and 955 are coaxial cables. Loop coil 910 includes a matching circuit 915 operably connected to loop 910. Matching circuit 915 may be operably connected to a power supply or to an MRI system. There are no matching circuits in loops 920, 930, or 940, which reduces the complexity and cost of example embodiments compared to conventional approaches. In one embodiment, transmission lines 951, 953, and 955 may have lengths λ/2 of the RF signal, or integer multiples of λ/2 of the RF signal.

Figure 10:
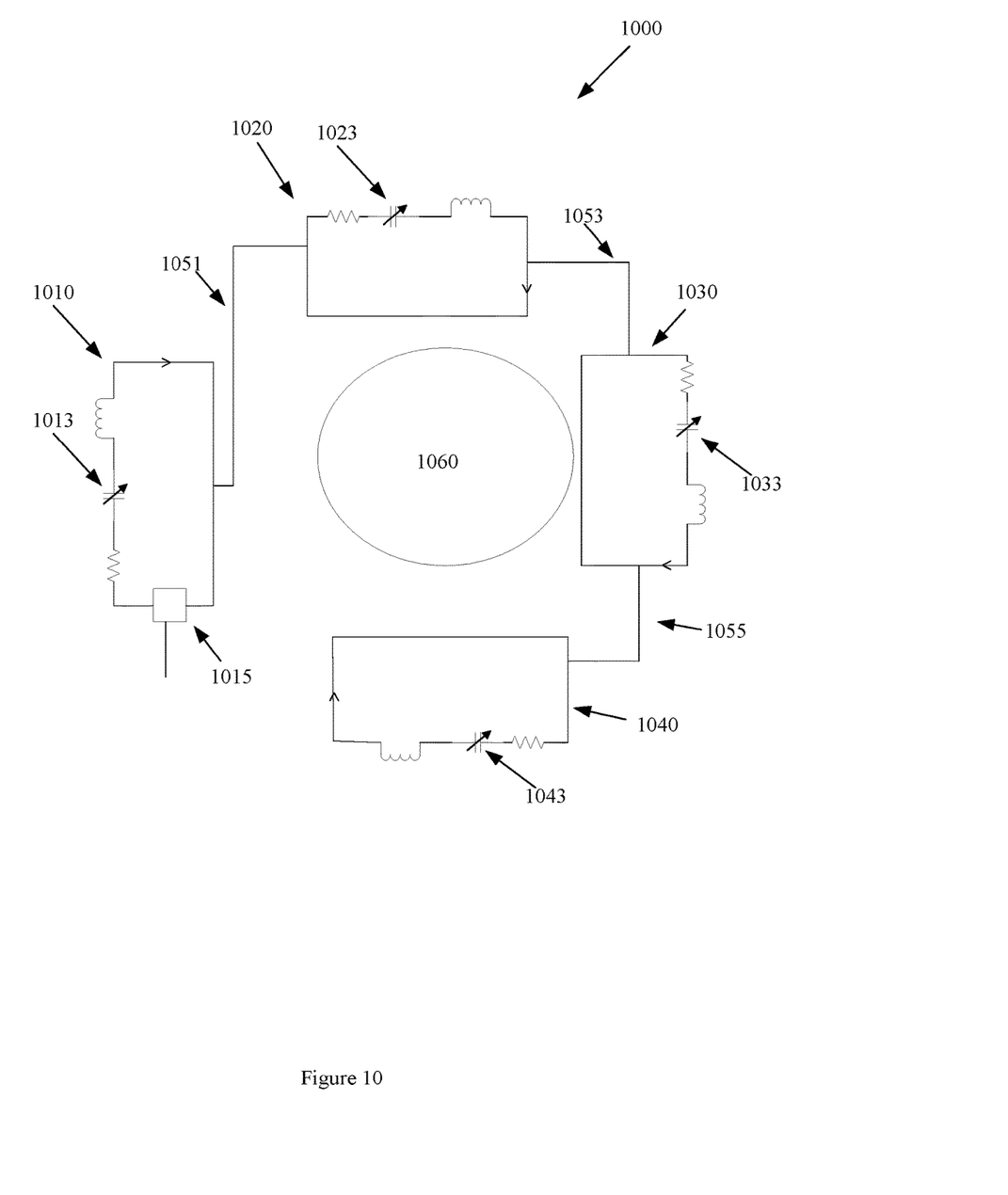
FIG. 10 illustrates an example MRI RF coil.

FIG. 10 illustrates a cylindrical MRI RF coil 1000 surrounding a subject 1060. MRI RF coil 1000 is operably connected with an MRI system, which, for clarity, is not illustrated. MRI RF coil 1000 may be, for example, a whole-body circular MRI RF coil. MRI RF coil 1000 is configured to facilitate generating customizable $B_1$ fields at different locations within cylindrical coil 1000. MRI RF coil 1000 comprises a first loop coil 1010, a second loop coil 1020, a third loop coil 1030, and a fourth loop coil 1040. First loop coil 1010, second loop coil 1020, third loop coil 1030, and fourth loop coil 1040 have architectures similar to the loop coils illustrated in FIG. 4, FIG. 6, FIG. 7, or FIG. 9. First loop coil 1010 comprises a matching circuit 1015. Matching circuit 1015 may be operably connected to a power supply or the MRI system. First loop coil 1010 is connected in series by a first transmission cable 1051 to second loop coil 1020. Second loop coil 1020 is connected in series by a second transmission cable 1053 with third loop coil 1030. Third loop coil 1030 is connected in series by a third transmission cable 1055 to fourth loop coil 1040. In one embodiment, first transmission cable 1051, second transmission cable 1053, and third transmission cable 1055 are $\lambda/4$ or odd multiples of $\lambda/4$ length co-axial cables.

FIG. 10 further illustrates a subject 1060 being imaged by the MRI system. Subject 1060 may be, for example, a patient, a phantom, or other subject. Note that subject 1060 may be positioned such that first loop coil 1010, second loop coil 1020, third loop coil 1030, and fourth loop coil 1040 are situated different distances from subject 1060. Since subject 1060 may be irregularly shaped, or may be located different distances away from first loop coil 1010, second loop coil 1020, third loop coil 1030, or fourth loop coil 1040, it may be desirable to generate different B1 fields at different locations within cylindrical coil 1000. By adjusting the impedance of second loop coil 1020, third loop coil 1030, or fourth loop coil 1040, the magnitude of current in second loop coil 1020, third loop coil 1030, or fourth loop coil 1040 may be adjusted. The impedance of second loop coil 1020, third loop coil 1030, or fourth loop coil 1040 may be adjusted by varying the capacitance of variable 1023, variable capacitor 1033, or variable capacitor 1043 respectively. Variable capacitor 1013 in first loop coil 1010 is thus employed for frequency tuning. A current magnitude ratio among first loop coil 1010, second loop coil 1020, third loop coil 1030, or fourth loop coil 1040 may be adjusted by adjusting the capacitance of variable capacitor 1023, variable capacitor 1033, or variable capacitor 1043, where the current magnitude is referenced against the current through first loop coil 1010. Thus, the $B_1$ field may be adjusted locally to first loop coil 1010, second loop coil 1020, third loop coil 1030, or fourth loop coil 1040 to facilitate achieving different sensitivities between first loop coil 1010, second loop coil 1020, third loop coil 1030, or fourth loop coil 1040. For example, a $B_1$ field corresponding to the location of second loop coil 1020 may be controlled to have a different magnitude than a $B_1$ field corresponding to the location of third loop coil 1030 by varying the impedance of second loop coil 1020 or third loop coil 1030.

In another embodiment of cylindrical MRI RF coil 1000, first transmission cable 1051, second transmission cable 1053, and third transmission cable 1055 are $\lambda/2$ or integer multiples of $\lambda/2$ length co-axial cables. In this embodiment, first loop coil 1010, second loop coil 1020, third loop coil 1030, and fourth loop coil 1040 are connected in parallel by first transmission cable 1051, second transmission cable 1053, and third transmission cable 1055. In this embodiment, first loop coil 1010, second loop coil 1020, third loop coil 1030, and fourth loop coil 1040 comprise a second capacitor. First transmission cable 1051, second transmission cable 1053, and third transmission cable 1055 are connected in parallel across the second capacitor to first loop coil 1010, second loop coil 1020, third loop coil 1030, and fourth loop coil 1040.

Figure 8:
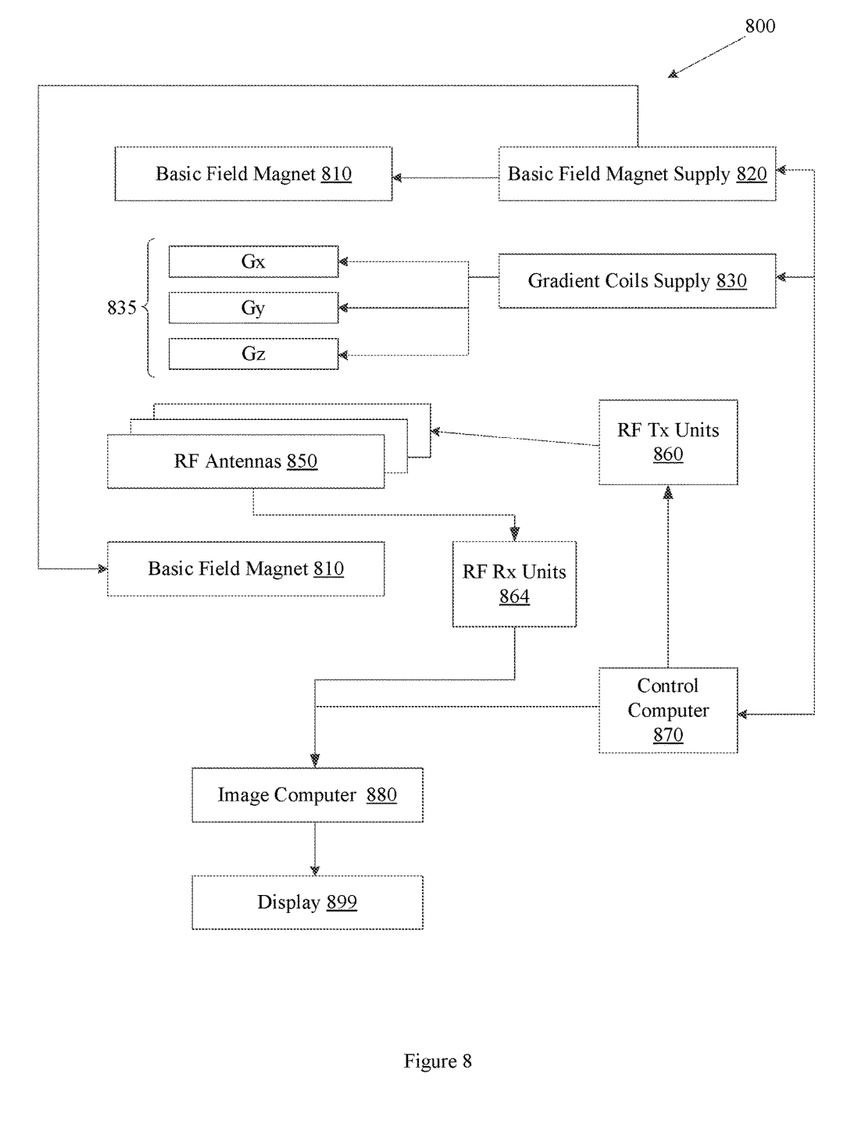
FIG. 8 illustrates an MRI apparatus configured with an example MRI RF coil.

FIG. 8 illustrates an example MRI apparatus 800 to which an example MRI RF coil may be coupled. The apparatus 800 includes a basic field magnet(s) 810 and a basic field magnet supply 820. Ideally, the basic field magnets 810 would produce a uniform $B_0$ field. However, in practice, the $B_0$ field may not be uniform, and may vary over an object being imaged by the MRI apparatus 800. MRI apparatus 800 may include gradient coils 835 configured to emit gradient magnetic fields like $G_x$, $G_y$, and $G_z$. The gradient coils 835 may be controlled, at least in part, by a gradient coils supply 830. In some examples, the timing, strength, and orientation of the gradient magnetic fields may be controlled and thus selectively adapted during an MRI procedure.

MRI apparatus 800 may include a set of RF antennas 850 that are configured to generate RF pulses and to receive resulting magnetic resonance signals from an object, including a patient, a subject, or a phantom, to which the RF pulses are directed. Members of the RF antennas 850 may include, for example, a coil or coils described herein, including MRI RF coil 400, MRI RF coil 600, MRI RF coil 700, MRI RF coil 900, or MRI RF coil 1000. The RF antennas 850 may be controlled, at least in part, by a set of RF transmission units 860. An RF transmission unit 860 may provide a signal to a member of the set of RF antennas 850. RF transmission unit 860 may provide a current, voltage, or control signal that causes members of the RF antennas 850 to resonate at a desired transmission frequency. Within a member of the RF antennas 850 that comprises an MRI RF coil as described herein, a current magnitude at different sections of the MRI RF coil may be controlled by varying the impedance of individual loop coils comprising the MRI RF coil. Thus, apparatus 800 facilitates generating customized $B_1$ fields at different points corresponding to the sections of the MRI RF coil that are experiencing different current magnitudes.

The gradient coils supply 830 and the RF transmission units 860 may be controlled, at least in part, by a control computer 870. The magnetic resonance signals received from the RF antennas 850 can be employed to generate an image, and thus may be subject to a transformation process like a two dimensional fast Fourier transform (FFT) that generates pixilated image data. The transformation can be performed by an image computer 880 or other similar processing device. The image data may then be shown on a display 899. While FIG. 8 illustrates an example MRI apparatus 800 that includes various components connected in various ways, it is to be appreciated that other MRI apparatus may include other components connected in other ways. In one example, MRI apparatus 800 may include control computer 870. In one example, a member of the set of RF antennas 850 may be individually controllable by the control computer 870.

The following includes definitions of selected terms employed herein. The definitions include various examples or forms of components that fall within the scope of a term and that may be used for implementation. The examples are not intended to be limiting. Both singular and plural forms of terms may be within the definitions.

References to "one embodiment", "an embodiment", "one example", and "an example" indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". The term "and/or" is used in the same manner, meaning "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

Although the subject matter has been described in language specific to structural features or methodological acts, it is to be understood that the subject matter defined in the appended claims is not necessarily limited to the specific features or acts described above. Rather, the specific features and acts described above are disclosed as example forms of implementing the claims.

What is claimed is:

1. A magnetic resonance imaging (MRI) radio frequency (RF) coil comprising:
    a plurality of loop coils configured to transmit or receive an RF signal, where a member of the plurality of loop coils comprises an inductor and at least one capacitor; and
    at least one coaxial transmission line that electrically couple a first member of the plurality of loop coils with a second, different member of the plurality of loop coils in series, where the at least one coaxial transmission line has a length that is one-quarter wavelength ($\lambda/4$) of the RF signal, or an odd integer multiple of $\lambda/4$ of the RF signal,
    where the at least one capacitor is a variable capacitor, where varying the capacitance of the at least one capacitor adjusts an impedance of the member of the plurality of loop coils that comprises the at least one capacitor.

2. The MRI RF coil of claim 1, where the at least one coaxial transmission line and the plurality of loop coils are configured to operate as a single coil.

3. The MRI RF coil of claim 1, where the at least one coaxial transmission line has an intrinsic impedance, where the intrinsic impedance has an imaginary component and a real component.

4. The MRI RF coil of claim 3, where the first member of the plurality of loop coils has a first impedance and first current magnitude, where the second member of the plurality of loop coils has a second impedance and a second current magnitude, and where adjusting the first impedance tunes the MRI RF coil.

5. The MRI RF coil of claim 4, where adjusting the second impedance to within a threshold of the imaginary component of the intrinsic impedance controls the second current magnitude to equal the first current magnitude.

6. The MRI RF coil of claim 1, further comprising a matching circuit operably connected to a member of the plurality of loop coils, where the matching circuit is operably connected to an MRI system.

7. The MRI RF coil of claim 1, where a member of the plurality of loop coils is individually tunable.

8. The MRI RF coil of claim 1, where the plurality of loop coils is configured as a saddle array.

9. The MRI RF coil of claim 1, where the plurality of loop coils is configured as a star-topology array.

10. The MRI RF coil of claim 1, where the plurality of loop coils is configured as a circular array or as a cylindrical array.

11. A magnetic resonance imaging (MRI) radio frequency (RF) coil configured to receive an RF signal or transmit an RF signal, the MRI RF coil comprising:
    a plurality of loop coils, where one or more of the plurality of loop coils comprises an inductor, a first capacitor, and a second capacitor; and
    at least one coaxial transmission line that electrically couples in parallel a first member of the plurality of loop coils with a second member of the plurality of loop coils, where the at least one coaxial transmission line comprises an inner conductor and a shield, where the inner conductor is connected to the first member of the plurality of loop coils at a first point corresponding to a first terminal of the second capacitor of the first member, and where the shield is connected to the first member of the plurality of loop coils across the second capacitor at a second point corresponding to the second terminal of the second capacitor of the first member, and where the inner conductor is connected to the second member of the plurality of loop coils at a first point corresponding to a first terminal of the second capacitor of the second member, and where the shield is connected to the second member of the plurality of loop coils across the second capacitor at a second point corresponding to the second terminal of the second capacitor of the second member.

12. The MRI RF coil of claim 11, where the at least one coaxial transmission line has a length equal to one-half wavelength ($\lambda/2$) of the RF signal or an integer multiple of $\lambda/2$ of the RF signal, where the at least one coaxial transmission line has an intrinsic impedance.

13. The MRI RF coil of claim 12, where the first capacitor is a first variable capacitor, or the second capacitor is a second variable capacitor.

14. The MRI RF coil of claim 13, where varying the capacitance of the second variable capacitor varies the impedance of the second member of the plurality of loop coils comprising the second variable capacitor.

15. The MRI RF coil of claim 14, where an inductor and a capacitor in the second member of the plurality of loop coils resonate with the second variable capacitor.

16. The MRI RF coil of claim 15, where the plurality of loop coils is configured as a whole-body coil circular array.

17. The MRI RF coil of claim 15, where the plurality of loop coils is configured as a saddle array, where the first loop coil is located at least 60 cm from the second loop coil.

18. The MRI RF coil of claim 12, where the first member of the plurality of loop coils further comprises a matching circuit, where the matching circuit is operably connected to an MRI system.

19. A magnetic resonance imaging (MRI) apparatus comprising:
    a controller; and
    a radio frequency (RF) coil operably connected to the controller, where the RF coil participates in the acquisition of MR data by transmitting an RF signal into a subject or by receiving an MR signal from the subject, where the controller provides the RF coil with a current, a voltage, or a control signal that causes the RF coil to resonate at a desired transmission frequency, where the RF coil comprises:
    at least two loop coils operably connected in series by a $\lambda/4$ coaxial transmission cable having a length that is an odd multiple of one-quarter of the wavelength of the RF signal or the MR signal, or connected in parallel by a $\lambda/2$ coaxial transmission cable having a length that is an integer multiple of one-half of the wavelength of the RF signal or the MR signal, where the λ/4 coaxial transmission cable or the λ/2 coaxial transmission cable has an intrinsic impedance, where a member of the at least two loop coils comprises:
an inductor; and
a variable capacitor, where the variable capacitor controls an impedance of the member of the at least two loop coils, where controlling the impedance of the member of the at least two loop coils to within a threshold of the intrinsic impedance controls a current magnitude in the member of the at least two loop coils to equal a current magnitude of a second, different member of the at least two loop coils.

20. The apparatus of claim 19, where the member of the at least two loop coils further comprises a second capacitor.

21. The apparatus of claim 20, where the λ/4 coaxial transmission cable or the λ/2 coaxial transmission cable comprises an inner conductor and a shield.

22. The apparatus of claim 21, where the inner conductor of the λ/2 coaxial transmission cable is connected to the member of the at least two loop coils at a first point corresponding to a first terminal of the second capacitor, and where the shield of the λ/2 coaxial transmission cable is connected to the member of the at least two loop coils across the second capacitor at a second point corresponding to a second terminal of the second capacitor.

* * * * *